United States Patent [19]

Matsuda et al.

[11] Patent Number: 5,780,881

[45] Date of Patent: Jul. 14, 1998

[54] GATE ARRAY DRIVEN BY SOURCE VOLTAGES AND ELECTRONIC EQUIPMENT USING THE SAME

[75] Inventors: Hiromichi Matsuda; Masayuki Oshima, both of Suwa, Japan

[73] Assignee: Seiko Epson Corporation, Tokyo, Japan

[21] Appl. No.: 622,369

[22] Filed: Mar. 27, 1996

[30] Foreign Application Priority Data

Mar. 30, 1995  [JP]  Japan .................................. 7-074262
Mar. 25, 1996  [JP]  Japan .................................. 8-094823

[51] Int. Cl.⁶ .................................................. H01L 27/10
[52] U.S. Cl. .......................... 257/202; 257/203; 257/207; 257/211
[58] Field of Search ............................ 257/202, 203, 257/207, 211

[56] References Cited

U.S. PATENT DOCUMENTS

| | | | |
|---|---|---|---|
| 4,890,146 | 12/1989 | Williams et al. | 257/202 |
| 5,083,178 | 1/1992 | Otsu | 257/202 |
| 5,225,693 | 7/1993 | Hirayama | 257/204 |
| 5,347,150 | 9/1994 | Sakai et al. | 257/203 |
| 5,420,447 | 5/1995 | Waggoner | 257/204 |
| 5,545,904 | 8/1996 | Orbach | 257/209 |

*Primary Examiner*—Valencia Martia Wallace
*Attorney, Agent, or Firm*—Oliff & Berridge, PLC

[57] ABSTRACT

A gate array driven by a plurality of source voltages and an electronic equipment using such a gate array are provided. The gate array comprises a plurality of P-well regions and a plurality of N-well regions, all of which are formed in an internal cell region in a first direction and alternately arranged in a second direction perpendicular to the first direction on a semiconductor substrate. A plurality of first basic cells receive a first source voltage VDD1 through a first source wiring layer, these first basic cells being respectively formed on a pair of P-well and N-well regions. A plurality of second basic cells receive a second source voltage VDD2 through a second source wiring layer, these second basic cells being respectively formed on a pair of P-well and N-well regions. A voltage level shifter for shifting the voltage level between data voltages outputted from first and second basic cell trains is formed on an region containing at least three of the P-well and N-well regions. The voltage level shifter is connected to a wiring layer which connects between the first and second basic cell trains.

20 Claims, 11 Drawing Sheets

GATE ARRAY DRIVEN BY SOURCE VOLTAGES AND ELECTRONIC EQUIPMENT USING THE SAME

BACKGROUND OF THE INVENTION

1. Field of the Invention

The present invention relates to a gate array driven by a plurality of different source voltages, and an electronic equipment using such a gate array.

2. Description of the Prior Art

In the gate arrays of the prior art driven by a plurality of different source voltages, a gate array of two-source operation type is mainly used. Such a gate array can input and output data based on two different voltages, first source voltage VDD1 and second source voltage VDD2.

Such a two-source operation type gate array may include an internal cell region 200 shown in FIG. 11. As can be seen from this figure, for example, the internal cell region 200 may comprises a logic circuit 202 for only handling the data based on the first source voltage VDD1, a first voltage level shifter 204 for shifting an external data voltage based on VDD2 to a data voltage based on VDD1, and a second voltage level shifter 206 for shifting an external data voltage based on VDD1 to a data voltage based on VDD2.

The first and second voltage level shifters 204, 206 are disposed in the internal cell region 200 along its top and bottom edges to facilitate the automated wiring in the logic circuit 202, as shown in FIG. 11. Thus, the area of the logic circuit 202 will have a rectangular configuration that can facilitate the automated wiring operation.

However, this raises a problem in that the first and second voltage level shifters 204, 206 occupy a large part of the internal cell region 200 and limit an area for the logic circuit 202. This reduces the integration level. Such a problem is magnified as the number of source voltages to be used increases from three. This counters the recent tendency of increasing the integration.

The gate array of the prior art is not desirable in power consumption since they require the first and second voltage level shifters 204, 206 each time when data based on a drive voltage other than the drive voltage for the logic circuit 202 is inputted into or outputted from the gate array.

The gate array of the prior art has a further disadvantage in that the area occupied by the voltage level shifters has an ineffective area since the two voltage level shifters are located spaced away from each other. Thus, the internal cell area cannot be effectively used.

SUMMARY OF THE INVENTION

It is therefore an object of the present invention to provide a gate array having an internal cell region which comprises a logic circuit driven by a plurality of source voltages, thereby reducing an area occupied by a voltage level shifter and increasing the integration level in the logic circuit, and also to provide an electronic equipment using such a gate array.

Another object of the present invention is to provide a gate array having an internal cell region which comprises only a single portion for a voltage level shifter, thereby effectively using the internal cell region, and also to provide an electronic equipment using such a gate array.

To this end, the present invention provides a gate array driven by a plurality of source voltages, comprising:

a plurality of basic cell trains, each of which includes a plurality of basic cells arranged in a first direction, the plurality of basic cell trains being arranged in a second direction perpendicular to the first direction;

a first source wiring layer for supplying a first source voltage to a first basic cell train which includes at least one of the basic cell trains;

a second source wiring layer for supplying a second source voltage different in voltage level from the first source voltage to a second basic cell train which includes at least one of the basic cell trains;

a voltage level shifter having a third basic cell train which includes at least one of the basic cell trains, for shifting voltage level of data voltages outputted from the first and second basic cell trains; and a wiring layer for connecting the first basic cell train with the second basic cell train through the voltage level shifter.

According to the present invention, a single gate array can include a plurality of circuits which are driven by a plurality of source voltages including the first and second source voltages. Therefore, various data from the circuits driven by different source voltages can be inputted into and/or outputted from the gate array without interposition of any voltage level shifter. The present invention only requires a voltage level shifter for transmitting data between the first and second basic cell trains driven by different source voltages. On transmission of the data, the voltage level shifter shifts the data voltage to a level adapted to the operation of one of the first and second basic cell trains which receives that data.

The voltage level shifter used in the present invention is different in function from that of the prior art. In addition, the voltage level shifter used in the present invention is not required to be divided and disposed separately at two locations for input/output as in the prior art, but can be collectively disposed in the internal cell region at a single location. The internal cell region is thus less occupied by the voltage level shifter. As a result, a space for functional cell portions can be increased to provide a high integration level.

The present invention also provides a gate array comprising:

a plurality of P-well regions and a plurality of N-well regions, each of which is formed on a semiconductor substrate in a first direction, the P-well and N-well regions being alternately arranged in a second direction perpendicular to the first direction;

a first basic cell train and a second basic cell train each of which includes at least one pair of the P-well and N-well regions adjacent to each other in the second direction;

a first source wiring layer for supplying a first source voltage to the first basic cell train;

a second source wiring layer for supplying a second source voltage different in voltage level from the first source voltage to the second basic cell train;

a voltage level shifter formed in an area containing at least three of the P-well and N-well regions adjacent to each other, for shifting voltage level of data voltages outputted from the first and second basic cell trains; and a wiring layer for connecting the first basic cell train with the second basic cell train through the voltage level shifter.

According to the present invention, the first basic cell train driven by the first source voltage, the second basic cell train driven by the second source voltage and the voltage level shifter for shifting the voltage level of the data voltages outputted from the first and second basic cell trains can be formed on the P-well and N-well regions which are formed on the semiconductor substrate.

It is preferred that the first basic cell train, the voltage level shifter and the second basic cell train are arranged in the second direction in the described order.

Thus, the voltage level shifter can be disposed between the first and second basic cell trains to provide the minimum signal line therebetween.

Alternatively, the first and second basic cell trains may be disposed at positions adjacent to each other in the second direction. In other words, the voltage level shifter may not necessarily be located, in layout, between the first and second basic cell trains. It is only required that the voltage level shifter is connected to the signal line between the first and second basic cell trains. This can be provided by arranging the wiring of the signal line. Thus, the voltage level shifter can be arranged in the internal cell region with a free layout. This can further improve the efficiency of usage of the internal cell region.

The present invention further provides a gate array comprising:

- a plurality of P-well regions and a plurality of N-well regions, each of which is formed on a semiconductor substrate in a first direction, the P-well and N-well regions being alternately arranged in a second direction perpendicular to the first direction;
- a first well region and a second well region formed by dividing at least one pair of the P-well and N-well regions adjacent to each other in the second direction into at least two regions in the first direction;
- a first basic cell train formed in the first well region;
- a second basic cell train formed in the second well region;
- a first source wiring layer for supplying a first source voltage to the first basic cell train;
- a second source wiring layer for supplying a second source voltage different in voltage level from the first source voltage to the second basic cell train;
- a voltage level shifter formed in a third well region containing at least three of the P-well and N-well regions adjacent to each other, for shifting voltage level of data voltages outputted from the first and second basic cell trains; and
- a wiring layer for connecting the first basic cell train with the second basic cell train through the voltage level shifter.

According to the present invention, the first and second basic cell trains driven by different source voltages are disposed in the first and second well regions formed by dividing the P-well and N-well areas into at least two areas in the first direction. Thus, the first and second basic cell trains can be arranged in the internal cell region with a freer layout. This can further improve the efficiency of usage of the internal cell region.

It is further preferred that the third well region is divided into at least two regions in the first direction and the voltage level shifter is formed in one of the divided regions.

Thus, the voltage level shifter will not occupy the overall length of the internal cell region in the first direction. Therefore, the area occupied by the voltage level shifter can be reduced, thereby further improving the efficiency of usage in the internal cell region.

The present invention further provides a gate array comprising:

- a basic cell region including a plurality of basic cells which are arranged in a matrix in a first direction and a second direction perpendicular to the first direction;
- an input/output cell region including a plurality of input cells and a plurality of output cells disposed therein;
- a first functional cell portion having a plurality of the basic cells disposed in a first region within the basic cell region;
- a second functional cell portion having a plurality of the basic cells disposed in a second region within the basic cell region;
- a first input cell portion provided within the input/output cell region and having at least one of the input cells for receiving a first source voltage;
- a second input cell portion provided within the input/output cell region and having at least one of the input cells for receiving a second source voltage different in voltage level from the first source voltage;
- a first source wiring layer for connecting the first functional cell portion with the first input cell portion;
- a second source wiring layer for connecting the second functional cell portion with the second input cell portion;
- a voltage level shifter having a plurality of the basic cells disposed in a third region within the basic cell region, for shifting voltage level of data voltages outputted from the first and second functional cell portions; and
- a wiring layer for connecting the first functional cell portion with the second functional cell portion through the voltage level shifter.

According to the present invention, the data inputted through the first input cell portion can be inputted into the first functional cell portion without interposition of the voltage level shifter. Similarly, the data inputted through the second input cell portion can be inputted into the second functional cell portion without interposition of the voltage level shifter. The voltage level shifter is used to provide a data voltage adaptable to the first and second functional cell portions only when the data are to be transmitted between the first and second functional cell portions.

Also in such a case, the first and second regions respectively including the first and second functional cell portions disposed therein can be arranged parallel to the first direction and located at different locations in the second direction.

Alternatively, the basic cell region may be divided into at least two regions in the first direction to dispose the first region in one of the divided regions and the second region in another one of the divided regions.

In the latter case, it is preferred that the first and second source wiring layers include sections extending in the second direction. This is because these sections can effectively supply the source voltages to the respective divided regions.

The present invention further provides an electronic equipment comprising:

the aforementioned gate array;

a first power source for outputting the first source voltage;

a second power source for outputting the second source voltage;

a first functional circuit connected to the gate array and driven by the first source voltage from the first power source; and a second functional circuit connected to the gate array and driven by the second source voltage from the second power source.

According to such an electronic equipment, the gate array can be structured with a higher integration level. This can improve the added value or miniaturize the logic circuit.

DETAILED DESCRIPTION OF THE PREFERRED EMBODIMENTS

The present invention will now be described by way of example with reference to the drawings.
(First Embodiment)

Figure 2:
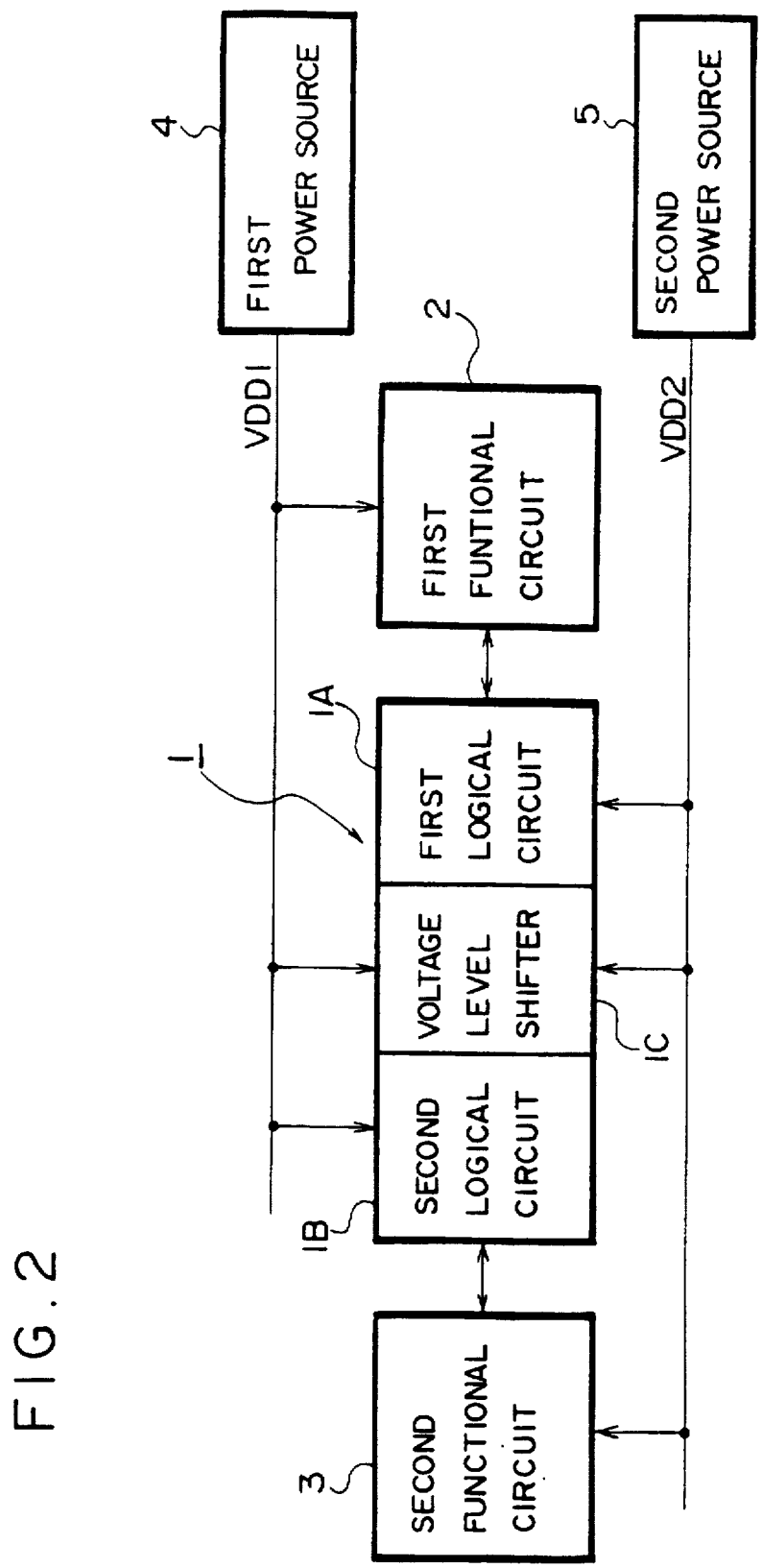
FIG. 2 is a block diagram schematically illustrating an electronic equipment into which the gate array shown in FIG. 1 is incorporated.

FIG. 2 is a schematic block diagram illustrating part of an electronic equipment which uses a gate array according to the present invention. Referring now to FIG. 2, the gate array 1 is connected to first and second functional circuits 2, 3 and first and second power sources 4, 5. The first power source 4 applies a first source voltage VDD1 (e.g., 3 volts) to the gate array 1 and the first functional circuit 2 as a drive voltage while the second power source 5 applies a second source voltage VDD2 (e.g., 5 volts) to the gate array 1 and the second functional circuit 3 as a drive voltage. Thus, the gate array 1 can be driven by two (first and second) source voltages different from each other.

The interior of the gate array 1 includes a first logic circuit 1A driven by the first source voltage VDD1 and a second logic circuit 1B driven by the second source voltage VDD2, as shown in FIG. 2. The gate array 1 also includes a voltage level shifter 1C for shifting the voltage level to a data voltage which is adapted to either of the first or second logic circuit (1A or 1B) when data is to be transmitted between the first and second logic circuits 1A, 1B.

Figure 1:
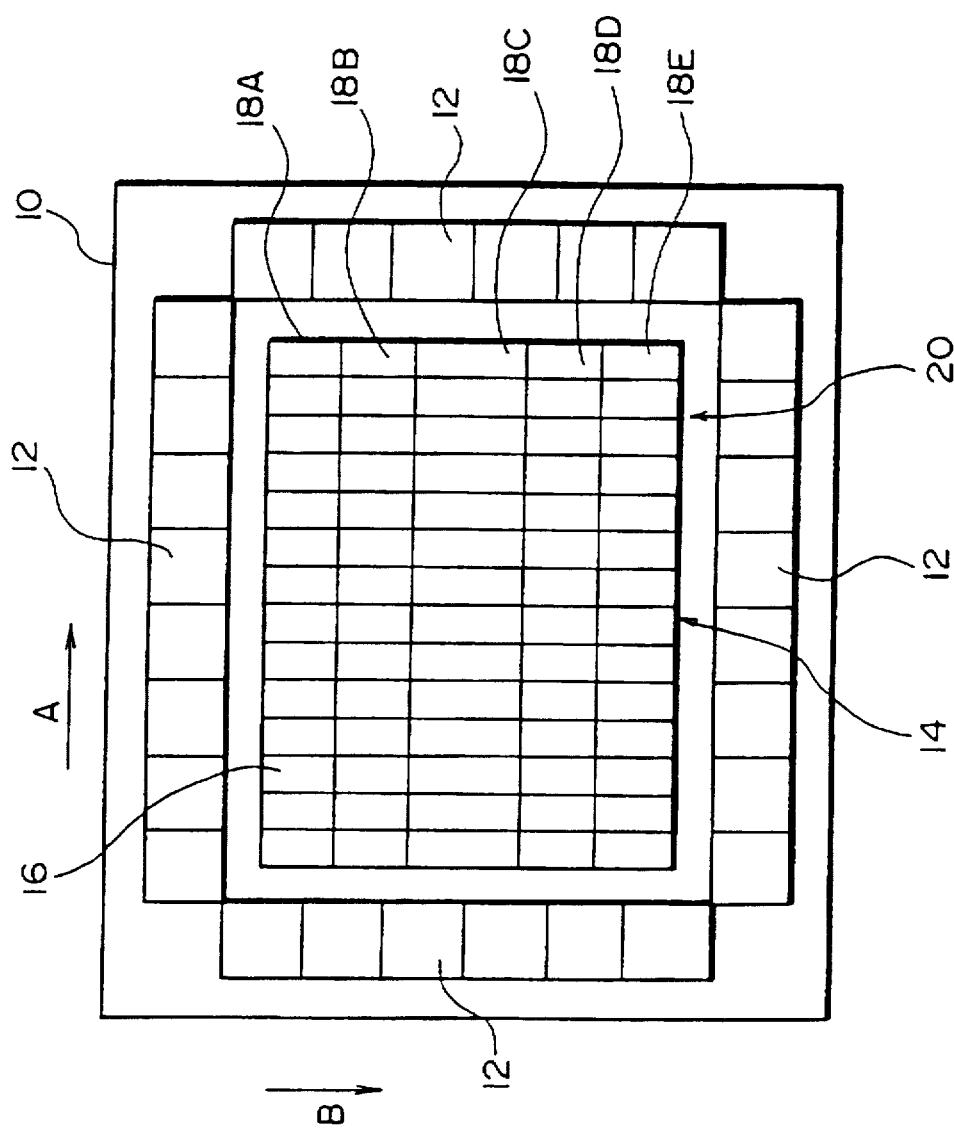
FIG. 1 is a plan view of a first embodiment of a gate array constructed in accordance with the present invention.

FIG. 1 is a schematic plan view of the gate array 1 shown in FIG. 2. The gate array 1 further includes input/output cells 12 which are disposed on a square chip 10 along its four marginal edges. These input/output cells 12 include an input cell portion for receiving the first source voltage VDD1 and another input cell portion for receiving the second source voltage VDD2.

The input/output cells 12 are surrounding an internal cell region 14 which includes basic cells 16 arranged in a matrix in first and second directions A, B. A plurality of basic cells 16 arranged in the first direction are wired to form a basic cell train. In this embodiment, it is assumed, for convenience' sake, that the gate array has first to fifth basic cell trains (18A, 18B, 18C, 18D and 18E) which are arranged along the second direction.

In other words, a plurality of basic cells 16 in the internal cell region 14 are connected to each other through upper wiring layers to form the first to fifth functional cell portions 18A–18E each of which has a logical function.

An exclusively wiring area 20 is provided between the input/output cells 12 and the internal cell region 14.

Figure 3:
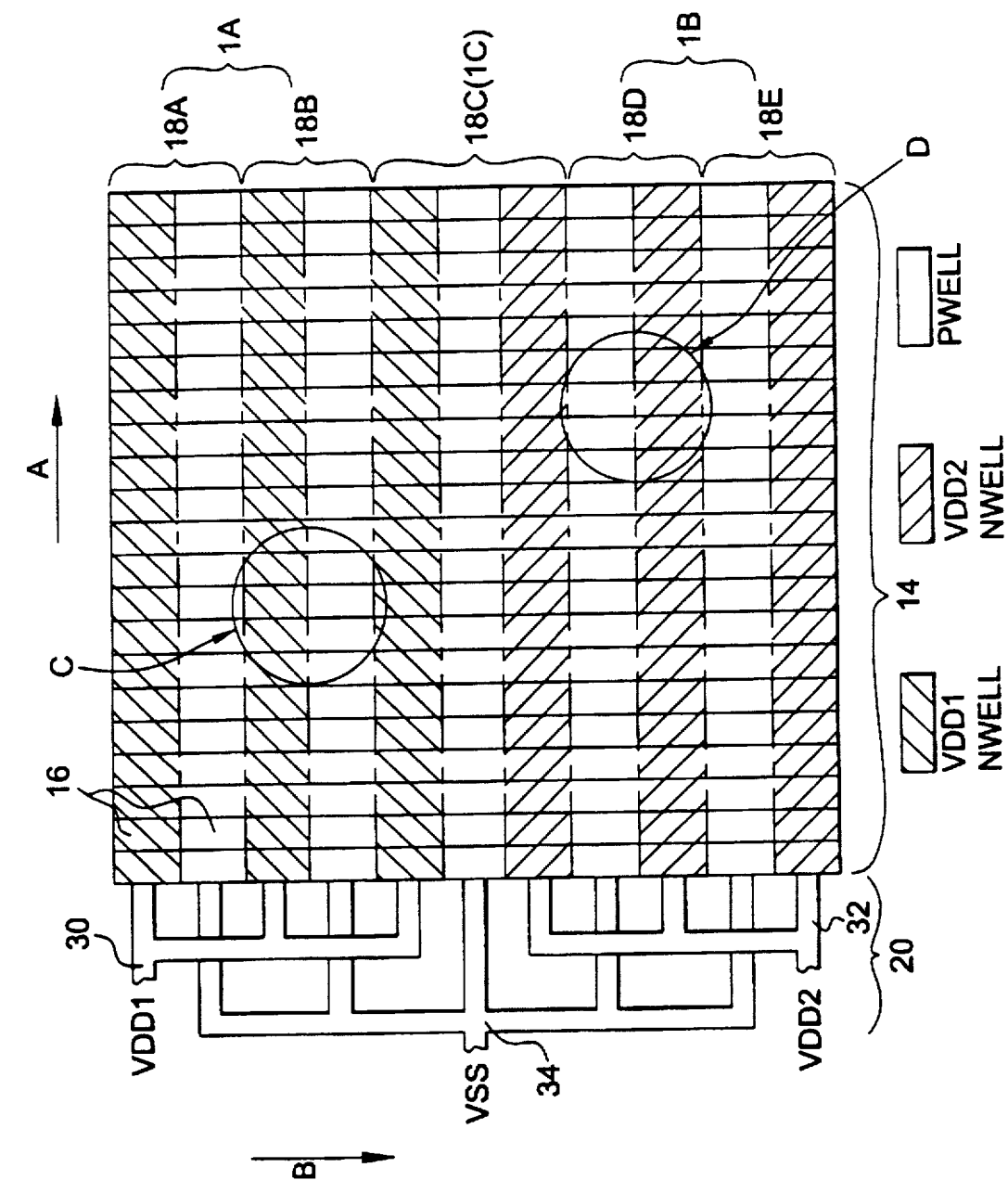
FIG. 3 is a schematic view illustrating the source wiring in the gate array shown in FIG. 1.

In this embodiment, the first logic circuit 1A is formed as a user circuit based on VDD1 by applying the first source voltage VDD1 to the first and second basic cell trains 18A, 18B, as shown in FIG. 3. Similarly, the second logic circuit 1B is formed as a user circuit based on VDD2 by applying the second source voltage VDD2 to the fourth and fifth basic cell trains 18D, 18E. The third basic cell train 18C forms a voltage level shifter 1C for shifting the voltage level to a data voltage adapted to either of the first or second logic circuit (1A or 1B) when data is to be transmitted between the first and second logic circuits 1A, 1B.

In this embodiment, the voltage level shifter 1C is disposed between the first and second logic circuits 1A, 1B in the internal cell region 14. The voltage level shifter 1C is also located on a signal line between the first and second logic circuits 1A, 1B. When the voltage level shifter 1C is arranged between the first and second logic circuits 1A, 1B in the aforementioned manner, the signal line can be minimized.

As shown in FIG. 3, the internal cell region 14 includes N-well regions NWELL and P-well regions PWELL which are respectively formed in the first direction A. These well regions NWELL and PWELL are alternately arranged in the second direction.

In this embodiment, the first, second, fourth and fifth basic cell trains (18A, 18B, 18D, 18E) are formed on the N-well and P-well regions NWELL, PWELL which are arranged adjacent to each other in the second direction. On the other hand, the third basic cell train 18C forming the voltage level shifter 1C is formed on three regions comprising an N-well region NWELL, a P-well region PWELL and another N-well region NWELL which are located adjacent to one another in the second direction B.

As shown in FIG. 3, a first source wiring layer 30 for supplying the first source voltage VDD1 is formed on the N-well regions NWELL of the first to third basic cell trains 18A–18C. Similarly, a second source wiring layer 32 for supplying the second source voltage VDD2 is formed on the N-well regions NWELL of the third to fifth basic cell trains 18C–18E. A third source wiring layer 34 for setting a ground voltage VSS is formed on the P-well regions PWELL of the first to fifth basic cell trains 18A–18E. The first to third source wiring layers 30, 32 and 34 are connected to the respective basic cells 16 through wiring layers 37 and contact holes 36a in a manner which will be described later.

Figure 4:
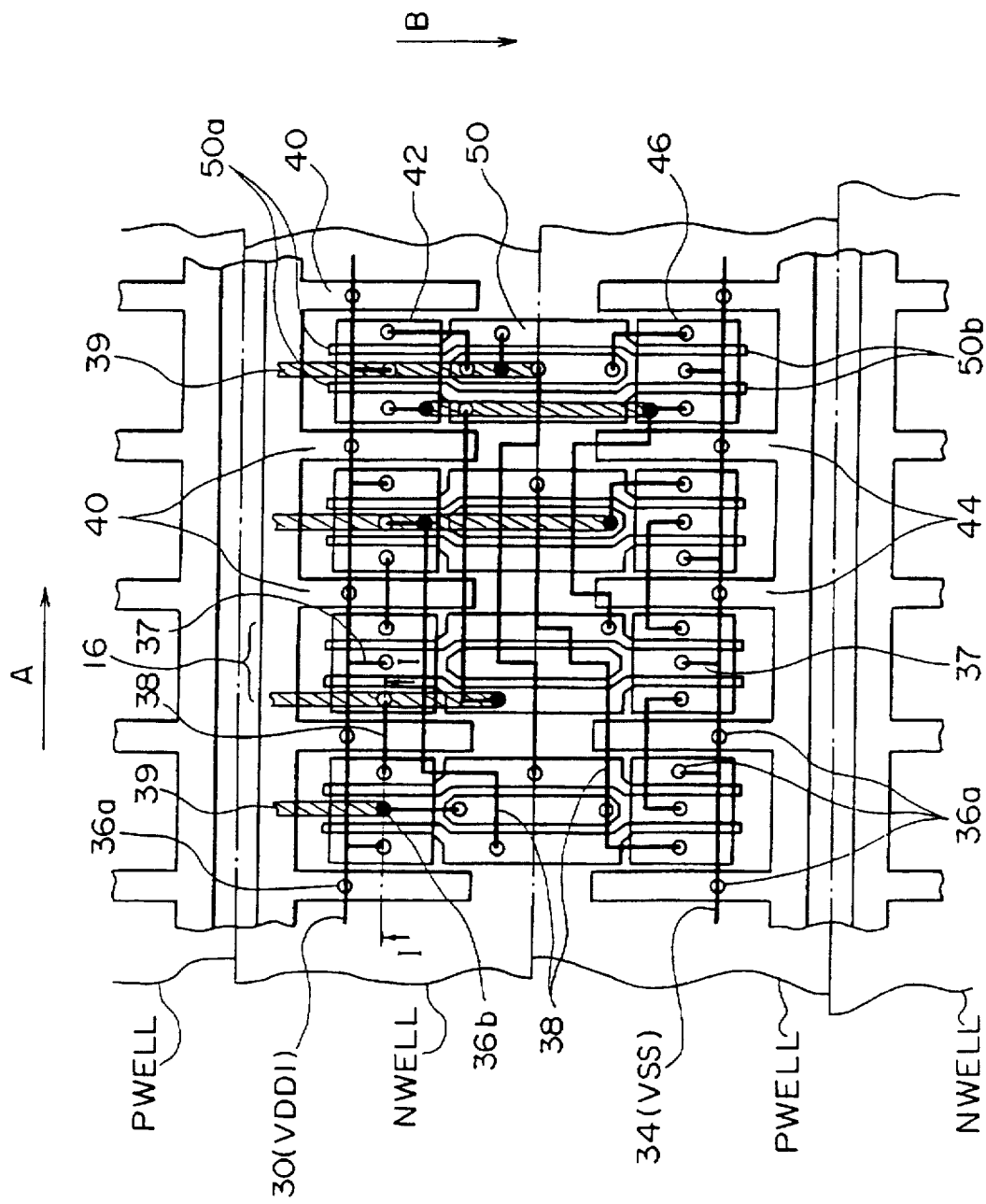
FIG. 4 is a view illustrating the details of a circled part C in FIG. 3.
Figure 5:
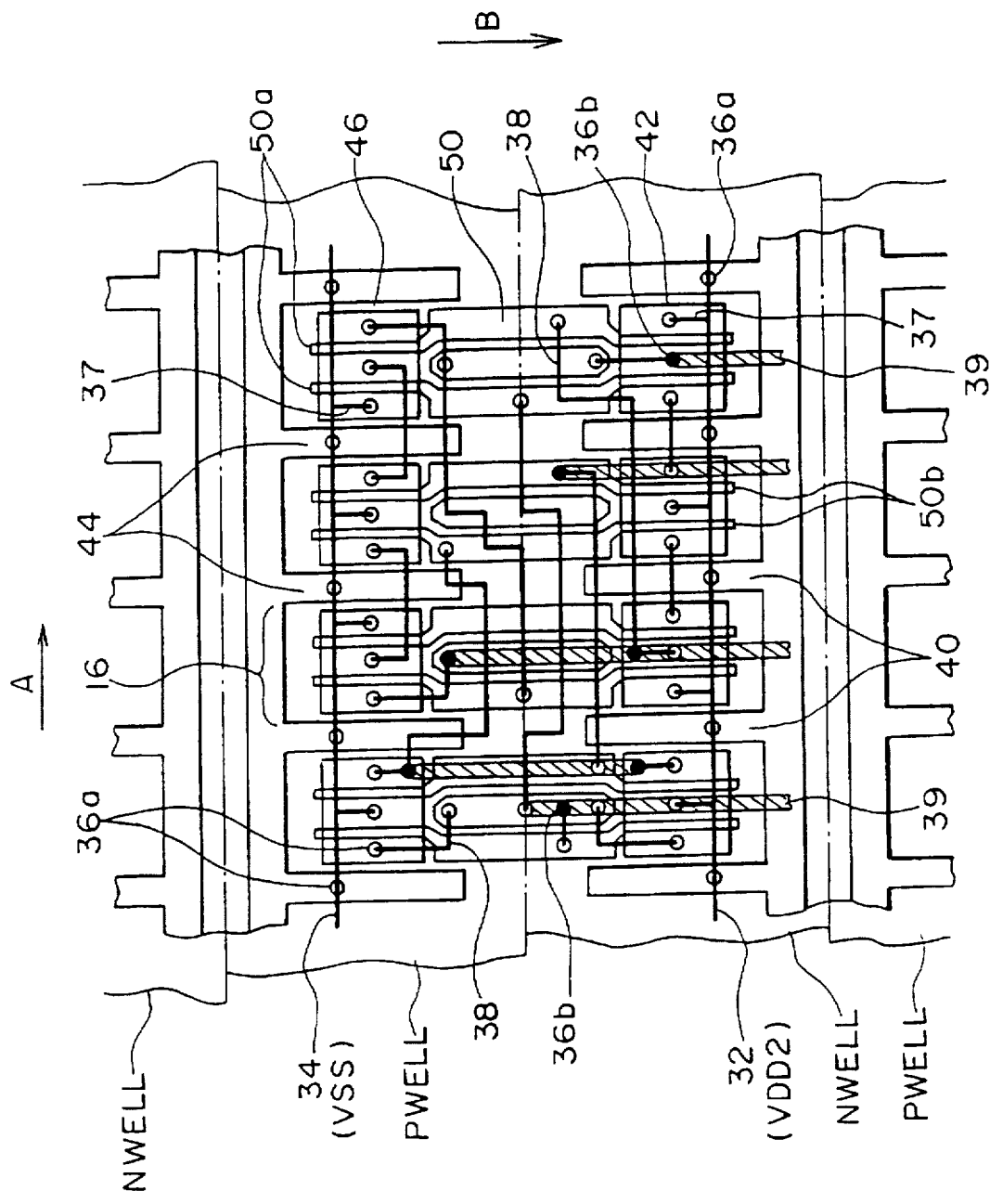
FIG. 5 is a view illustrating the details of another circled part D in FIG. 3.

The details of circled parts C and D in FIG. 3 are shown in FIGS. 4 and 5, respectively.

Referring now to FIGS. 4 and 5, each of the N-well regions NWELL includes P-type diffusion regions 42 each of which is disposed thereon between one pair of stopper N-type diffusion regions 40. On the other hand, each of the P-well regions PWELL includes N-type diffusion regions 46 each of which is disposed thereon between one pair of stopper P-type diffusion regions 44. A polysilicon region 50 is formed on the adjacent N-well and P-well regions NWELL, PWELL such that the opposite ends of the polysilicon region 50 are on the respective P-type and N-type diffusion regions 42, 46. This polysilicon region 50 functions as a gate electrode for P-channel and N-channel type MOS transistors, the opposite ends thereof functioning as gates 50a and 50b, respectively.

The P-type diffusion region 42 and the gate 50a define a P-channel type MOS transistor, and the N-type diffusion region 46 and gate 50b define an N-channel type MOS transistor. Two transistors located opposite to each other in the second direction B define one basic cell 16.

In FIG. 4, the first and third source wiring layers 30, 34 are disposed on the top layer of the basic cell 16 parallel to each other in the first direction A. In FIG. 5, similarly, the second and third source wiring layers 32, 34 are disposed on the top layer of the basic cell 16 parallel to each other in the first direction A.

The first, second and third source wiring layers 30, 32 and 34 are connected to the respective basic cells 16 by connecting these source wiring layers to the gates or other parts of the respective transistors through the contact holes 36a and wiring layers 37. A set of the basic cells 16 arranged in the first direction are connected to one another through wiring layers 38 to form a basic cell train. The first to third source wiring layers and the wiring layers 37 and 38 can be formed as first metal wiring layers, for example.

The first, second and third source wiring layers 30, 32 and 34 are not necessarily required to be formed extending in the first direction A. They may be connected to the stopper N-type or P-type diffusion region (40 or 44) through the contact holes 36a at the ends of the internal cell region 14. In such a case, the connection of the source wiring layers to the basic cells may be performed through the stopper N-type or P-type diffusion region (40 or 44) which extends in the first direction A. However, such wirings as shown in FIGS. 3–5 is more preferred since the positions of the first, second and third source wiring layers 30, 32 and 34 and contact holes 36a are not required to be changed even if the channel length in the MOS transistor is varied.

The third basic cell train 18C includes basic cells which are formed on the N-well region NWELL connected to the first source wiring layer 30 and the P-well region PWELL. The third basic cell train 18C also includes basic cells which are formed on the N-well region NWELL connected to the second source wiring layer 32 and the P-well region PWELL. When these basic cells are connected together, a known logic circuit for voltage level shifting will be formed.

In this embodiment, such wirings as shown by hatching lines in FIGS. 4 and 5 are formed by second metal wiring layers 39. These second metal wiring layers 39 define signal lines between the basic cells. Each of the second metal wiring layers is connected to the respective one of the lower wiring layers 37 and 38 through VIA's 36b that are shown by black spots.

The second metal wiring layers 39 connect between the first and second basic cell trains 18A, 18B and between the fourth and fifth basic cell trains 18D, 18E to form the first and second logic circuits 1A, 1B. The second metal wiring layers 39 further connect between the first and second logic circuits 1A, 1B through the voltage level shifter 1C, thereby transmitting data between the first and second logic circuits.

Figure 6:
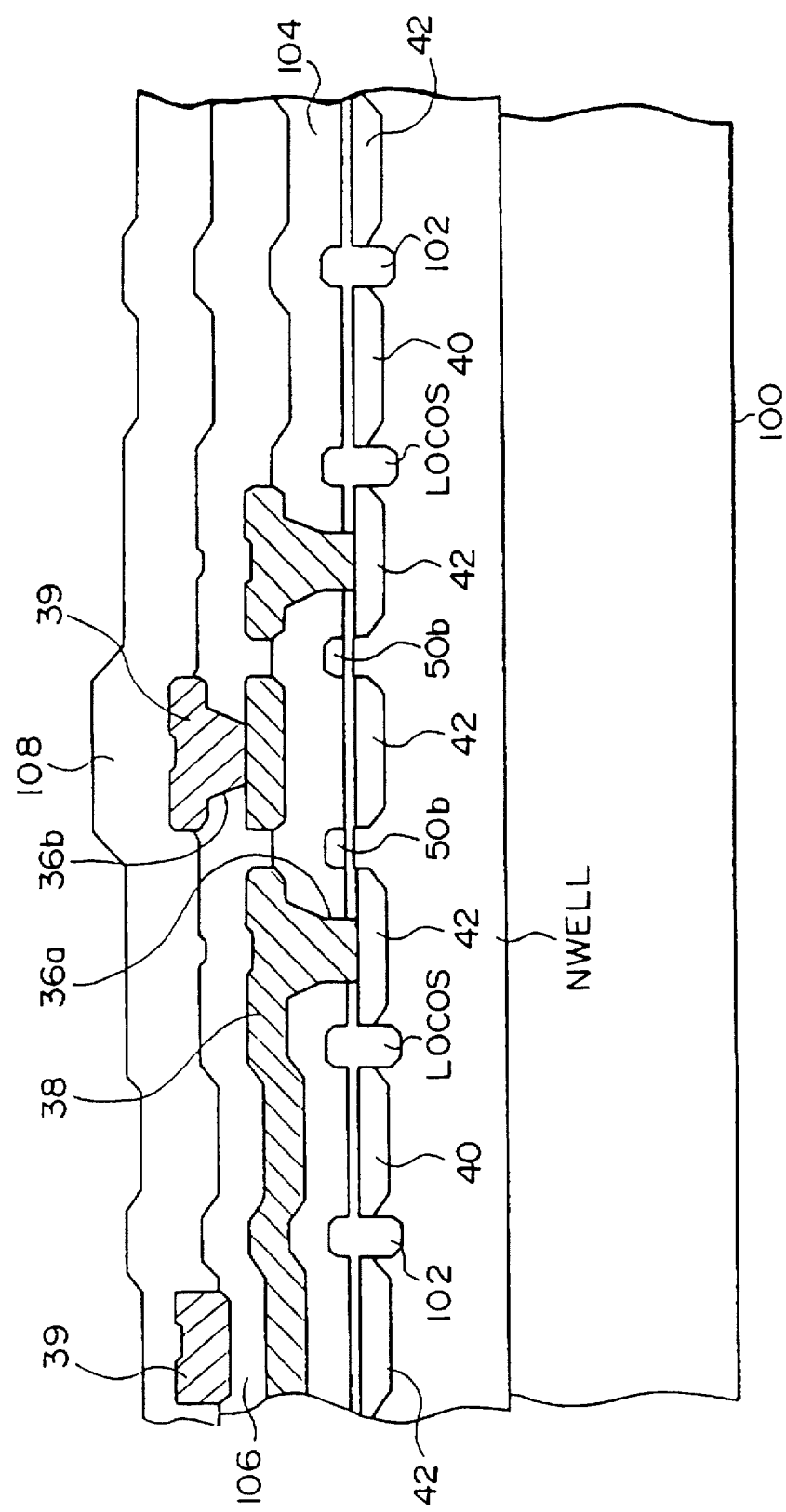
FIG. 6 is a sectional view taken along a line I—I in FIG. 4.

A fragmental cross-section of such a gate array 1 taken along a line I—I in FIG. 4 is shown in FIG. 6. An N-well region NWELL is formed on an N-type semiconductor substrate 100. Three P-type diffusion regions 42 are formed on the N-well region NWELL in an area defined by two stopper N-type diffusion regions 40 and two LOCOS's (local oxidation of silicon). Two gates 50b exist on pad oxide films 102. The wiring layer 38 of the first metal wiring layer is formed on an insulation film 104 and brought into contact with the P-type diffusion regions 42 through the contact holes 36a. The second metal wiring layer 39 is formed on an insulation film 106 and brought into contact with the wiring layer 38 of the first metal wiring layer through the VIA's 36b. A passivation film 108 is further formed over the second metal wiring layer 39.

The voltage level shifter 1C which is the third basic cell train 18C is connected to the second metal wiring layer 39 which connects the first logic circuit 1A with the second logic circuit 1B. The voltage level shifter 1C shifts the voltage of an output data from the first logic circuit 1A driven by the first source voltage VDD1 (e.g., 3 volts) to a voltage level adapting to the second logic circuit 1B driven by the second source voltage VDD2 (e.g., 5 volts). The voltage level shifter also shifts the voltage of an output data from the second logic circuit 1B driven by the second source voltage VDD2 to a voltage level adapting to the first logic circuit 1A driven by the first source voltage VDD1.

In the first embodiment, the data from the first functional circuit 2 driven by the first source voltage VDD1 is inputted into the first logic circuit 1A, as shown in FIG. 2, through the input/output cells 12 of the gate array 1. At this time, the first logic circuit 1A can receive the data without interposition of the voltage level shifter since it is also driven by the first source voltage VDD1. The first logic circuit 1A can process the input data according to a predetermined logic and then output the processed data toward the first functional circuit 2 through the input/output cells 12. Alternatively, the first logic circuit 1A may deliver the data to the second logic circuit 1B, if necessary. At this time, the data voltage of the data from the first logic circuit 1A is adjusted to a data voltage adapting to the second logic circuit 1B by the voltage level shifter 1C. After processed by the second logic circuit 1B, the data can be outputted toward the second functional circuit 3 through the input/output cells 12. The data can be outputted without interposition of the voltage level shifter since both the second logic circuit 1B and second functional circuit 3 are driven by the second source voltage VDD2. Alternatively, the data processed by the second logic circuit 1B may be returned to the first logic circuit 1A through the voltage level shifter 1C and then outputted therefrom toward the first functional circuit 2 through the input/output cells 12.

On the other hand, the data from the second functional circuit 3 driven by the second source voltage VDD2 may be inputted into the second logic circuit 1B through the input/output cells 12, and then returned to the second functional circuit 3 or outputted toward the first functional circuit 2 through the first logic circuit 1A in the same manner. Also at this time, the data can be inputted or outputted without interposition of the voltage level shifter except when the data is to be transmitted between the first and second logic circuits 1A, 1B.

Figure 11:
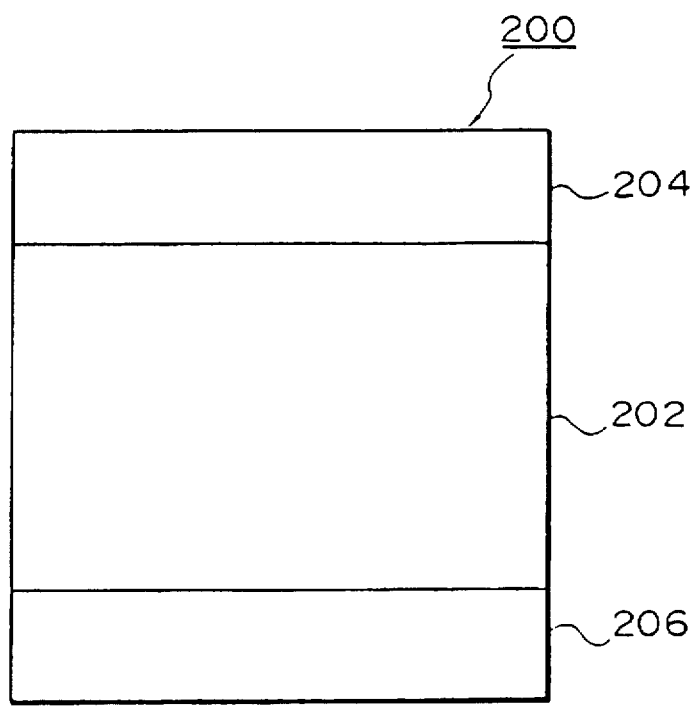
FIG. 11 is a schematic view of a gate array constructed in accordance with the prior art, the gate array being driven by a plurality of source voltages.

Furthermore, the area of the internal cell region 14 occupied by the voltage level shifter in the first embodiment of the gate array can be reduced in comparison with the prior art gate array shown in FIG. 11. While the gate array of FIG. 11 necessarily requires two basic cell trains, the first embodiment only requires a single basic cell train 18C defining the voltage level shifter 1C.

(Second Embodiment)

Figure 7:
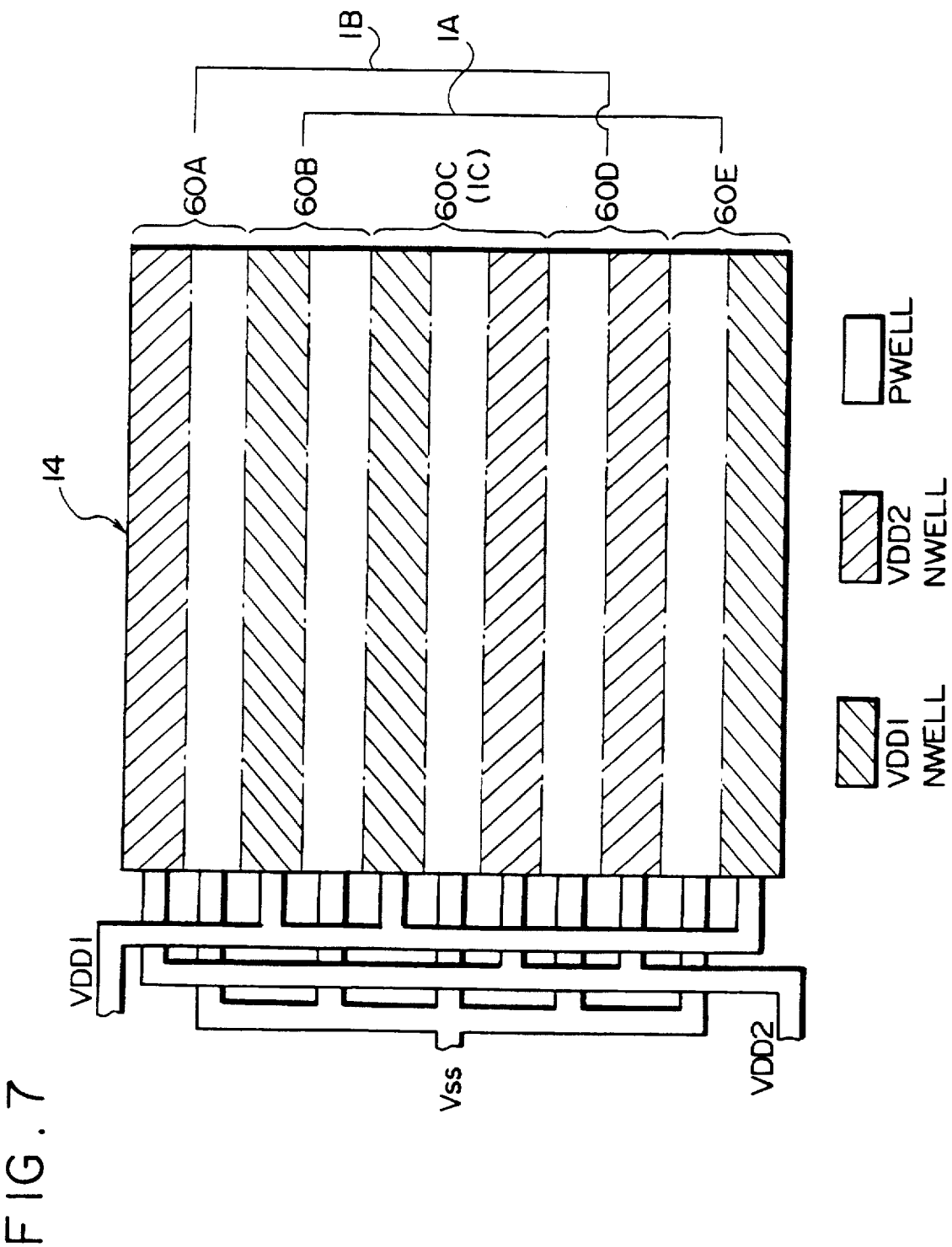
FIG. 7 is a schematic view illustrating the basic cell train layout and source wiring in a second embodiment of a gate array constructed in accordance with the present invention.

The gate array 1 shown in FIG. 2 may have such a structure as shown in FIG. 7 in place of the structure shown in FIG. 3. Referring to FIG. 7, a voltage level shifter is formed by a third basic cell train 60C, on one side of which a first basic cell train 60A driven by the second source voltage VDD2 and a second basic cell train 60B driven by the first source voltage VDD1 are disposed. On the opposite side of the third basic cell train 60C there are similarly disposed a fourth basic cell train 60D driven by the second source voltage VDD2 and a fifth basic cell train 60E driven by the first source voltage VDD1.

The layout shown in FIG. 7 is particularly suitable for use in the transmission of data between the second and fourth basic cell trains 60B, 60D through the voltage level shifter 60C. This can make the wiring between the second and fourth basic cell trains 60B, 60D minimum. In such a case, the first and fifth basic cell trains 60A, 60E can be freely arranged without dependency on the position of the voltage level shifter 60C.

The layout shown in FIG. 7 may also be used to form the gate array 1 shown in FIG. 2. In this case, the first logic circuit 1A shown in FIG. 2 may be formed by the second and fifth basic cell trains 60B, 60E while the second logic circuit 1B may be formed by the first and fourth basic cell trains 60A, 60D.

Since the basic cell trains can be freely connected to each other through the upper wiring layer, it is not required that a logic circuit is formed only in the area on one side of the voltage level shifter.

The basic cell train forming the voltage level shifter is not necessarily arranged between two logic circuits driven by different drive voltages. The basic cell train forming the voltage level shifter may be disposed on the end of the internal cell region.

(Third Embodiment)

Figure 8:
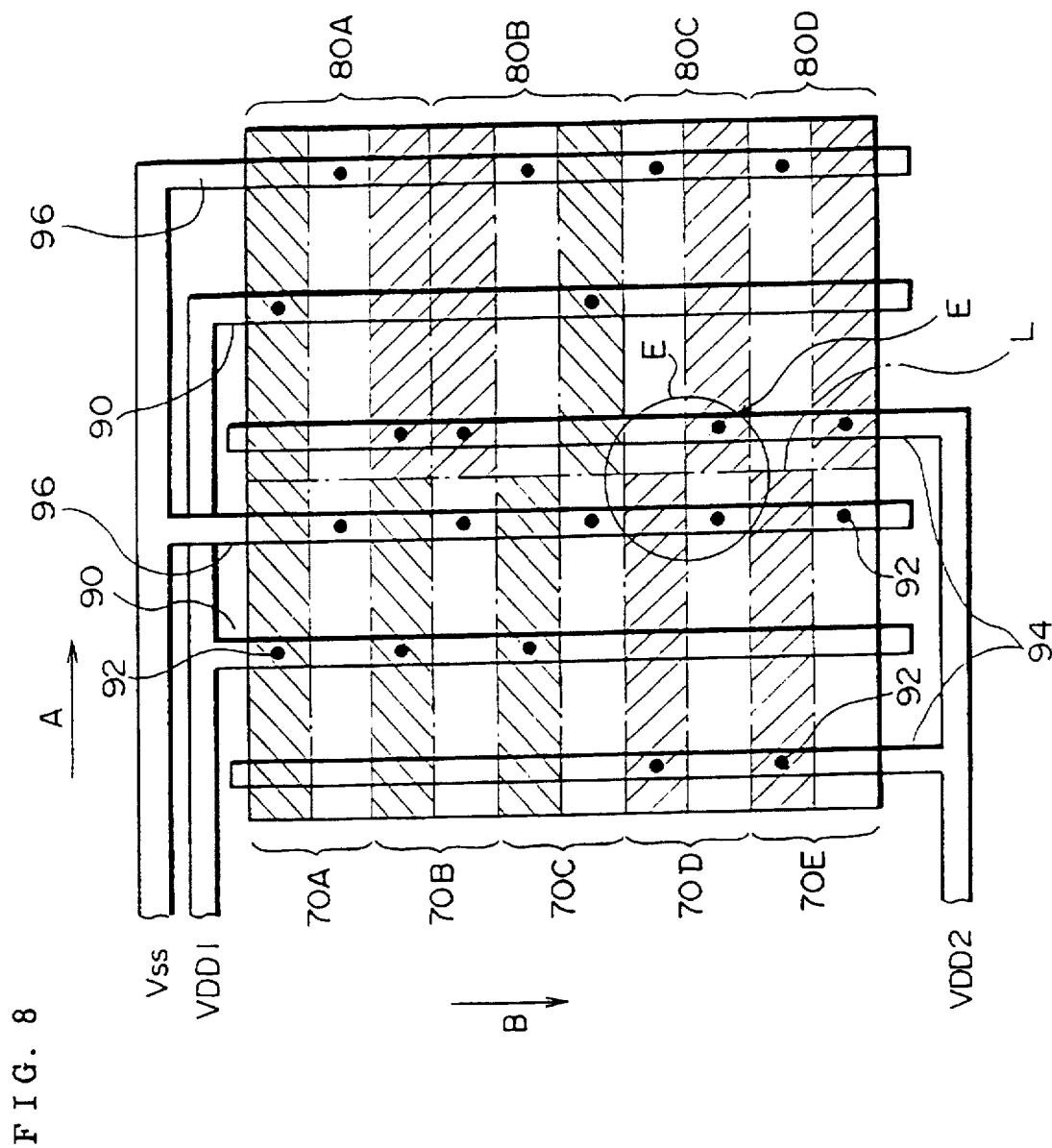
FIG. 8 is a schematic view illustrating the basic cell train layout and source wiring in a third embodiment of a gate array constructed in accordance with the present invention.
Figure 9:
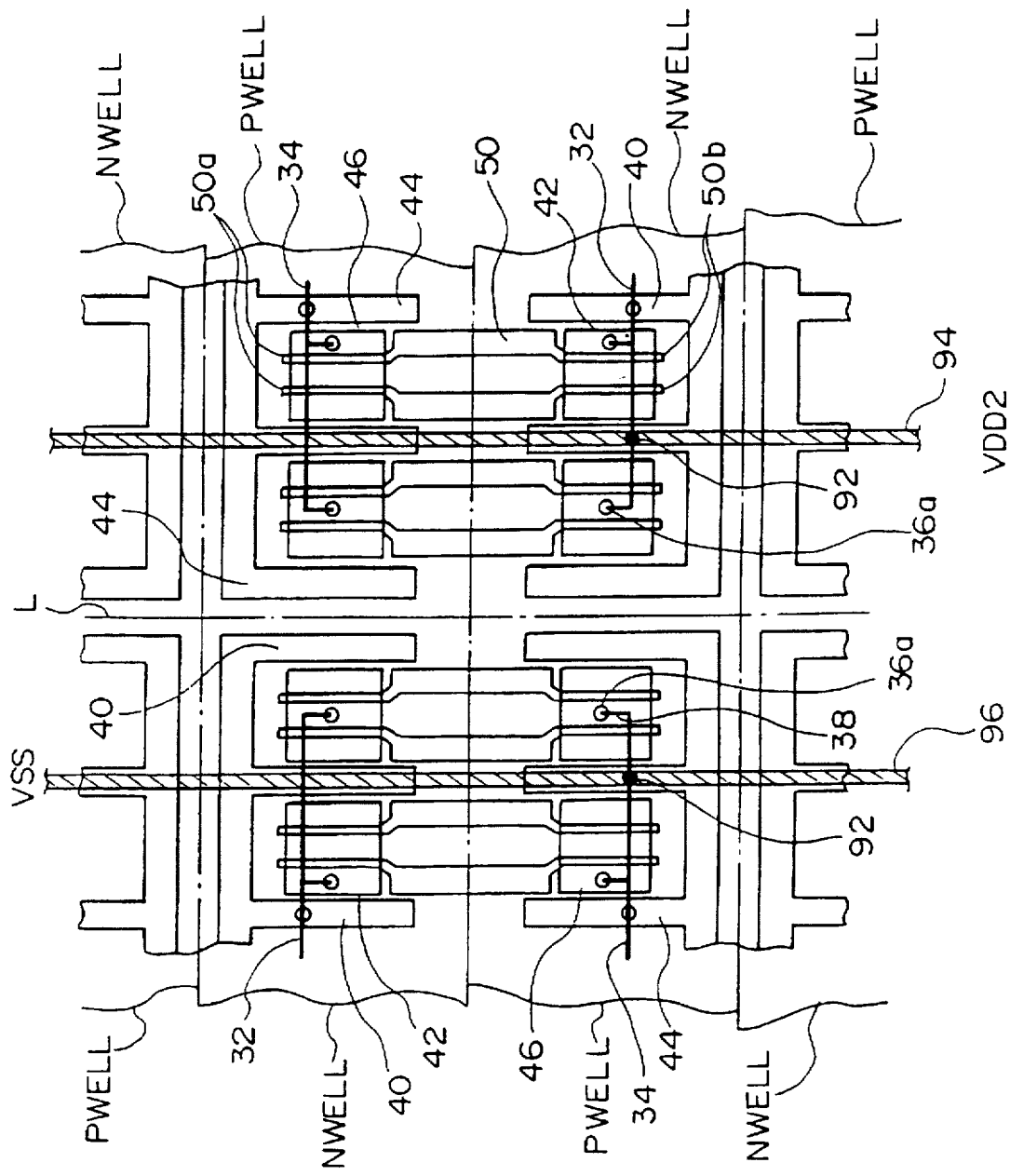
FIG. 9 is a view illustrating the details of a circled part E in FIG. 8.

A third embodiment of the present invention is shown in FIGS. 8 and 9. As shown in FIG. 8, the third embodiment comprises a plurality of paired P-well and N-well regions PWELL, NWELL which are formed on a semiconductor substrate to extend in the first direction A and located adjacent to each other in the second direction B. The paired P-well and N-well regions PWELL, NWELL are divided into right- and left-hand sections (in the first direction A) by a center line L.

The left-hand section of FIG. 8 includes a basic cell train formed in the first direction A and on the P-well and N-well regions PWELL, NWELL which are located adjacent to each other in the second direction B. As a result, first to fifth basic cell trains 70A–70E will be formed in the left-hand section of FIG. 8.

The right-hand section of FIG. 8 includes first and second basic cell trains 80A, 80B each of which is formed over three well regions, that is, an N-well region NWELL, a P-well region PWELL and another N-well region NWELL which are located adjacent to one another in the second direction B. The other part in the right-hand section of FIG. 8 includes third and fourth basic cell trains 80C, 80D each of which is formed over each pair of adjacent N-well region NWELL and P-well region PWELL in the second direction B.

The first, to third basic cell trains 70A–70C in the left-hand section of FIG. 8 receive the first source voltage VDD1 through first source wiring layers 90 extending in the second direction B and VIA's 92. The fourth and fifth basic cell trains 70D, 70E in the left-hand section of FIG. 8 and the third and fourth basic cell trains 80C, 80D in the right-hand section of FIG. 8 receive the second source voltage VDD2 through second source wiring layers 94 extending in the second direction B and VIA's 92. The first to fifth basic cell trains 70A–70E in the left-hand section and the third and fourth basic cell trains 80C, 80D in the right-hand section receive a VSS voltage through third source wiring layers 96 extending in the second direction B and VIA's 92.

In the third embodiment of FIG. 8, thus, the basic cell trains respectively driven by different source voltages exist together on one line in the first direction A while a plurality of such lines exist in the second direction B. Therefore, the power supply may be effectively carried out by extending the source wiring layers 90, 94 and 96 for supplying the first and second source voltages VDD1, VDD2 and VSS voltage.

The first logic circuit 1A driven by the first source voltage VDD1 (see FIG. 2) can be formed by the first to third basic cell trains 70A–70C in the left-hand section of FIG. 8. Further, the second logic circuit 1B driven by the second source voltage VDD2 (see FIG. 2) can be formed by the fourth and fifth basic cell trains 70D, 70E in the left-hand section of FIG. 8 and the fourth and fifth basic cell trains 80C, 80D in the right-hand section.

The first and second basic cell trains 80A, 80B in the right-hand section of FIG. 8 receive the first and second source voltages VDD1, VDD2 and the VSS voltage through the first to third source wiring layers 90, 94, 96 and VIA's 92. The first and second basic cell trains 80A, 80B can form the voltage level shifter 1C shown in FIG. 2.

According to the third embodiment, thus, the basic cell trains 80A, 80B forming the voltage level shifter 1C can be disposed in part of the internal cell region (e.g., its right-hand corner area) without occupation of the overall internal cell region 14 in the first direction A. The efficiency of usage in the internal cell region can be improved since the first and second source voltages VDD1, VDD2 can be supplied to the respective one of the N-well regions NWELL divided in the first direction A.

The details of a circled part E including the boundary between the left- and right-hand sections of FIG. 8 are shown in FIG. 9 wherein parts similar to those of FIGS. 4 and 5 are designated by similar reference numerals. In FIG. 9, however, the wiring layer 38 connecting between the basic cells as well as the second metal wiring layer 39 connecting between the basic cell trains will be omitted.

As shown in FIG. 9, well regions are formed and separated from one another by the center line L which divides the internal cell region 14 into two sections. This can be accomplished by using a mask on the ion-implantation.

Stopper N-type and P-type diffusion regions 40, 44 are separated from each other by the center line L.

As shown in FIG. 9, the second and third source wiring layers 94, 96 are formed as second metal wiring layers. The second and third source wiring layers 94, 96 are connected to the source wiring layers 32, 34 extending in the first direction A that are the first metal wiring layers, through VIA's 92. These source wiring layers 32 and 34 are connected to the basic cells through the contact holes 36a, as in FIGS. 4 and 5.

The second and third source wiring layers 94, 96 extend in the second direction B at positions opposite to the stopper N-type and P-type diffusion regions 40, 44. Thus, the area for the wiring layer 39 connecting the basic cell trains (not shown in FIG. 9) will not be reduced.

Although the basic cell trains forming the first and second logic circuits 1A, 1B are shown to be arranged adjacent to one another in the first or second direction (A or B) in FIG. 8, the present invention is not limited to such an arrangement. The basic cell trains driven by the same drive voltage may be separated from one another in a unit of N-well region NWELL and disposed at locations spaced away from one another, if only these basic cell trains are connected to one another through the upper wiring layers. The basic cell train forming the voltage level shifter 1C may be freely disposed in the internal cell region 14.

Figure 10:
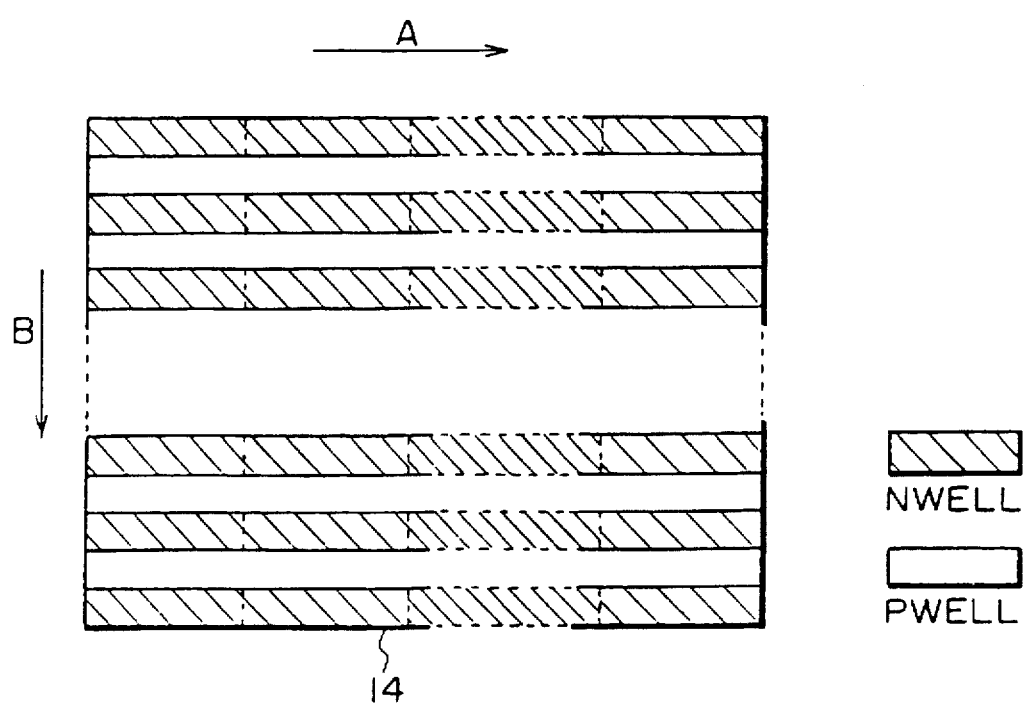
FIG. 10 is a schematic view illustrating a further embodiment in which well regions are divided into four sections in the internal cell region.

The well regions may be divided into three or more sections in the first direction A, as shown in FIG. 10. When the number of divided sections is increased such that a power source for the N-well regions NWELL is freely selected, various circuits driven by different power sources can effectively exist together in the same internal cell region 14. Thus, the efficiency of usage in the internal cell region 14 can be further improved.

The present invention is not limited to the aforementioned embodiments, but may be carried out in any of various modifications within the scope of the present invention.

Although two different drive voltages VDD1 and VDD2 are used in the aforementioned embodiments of the present invention, three or more different drive voltages VDD may be used in the present invention.

What is claimed is:

1. A gate array driven by a plurality of source voltages, comprising:
   a plurality of basic cell trains, each of which includes a plurality of basic cells arranged in a first direction, said plurality of basic cell trains being arranged in a second direction perpendicular to said first direction;
   a first source wiring layer for supplying a first source voltage to a first basic cell train which includes at least one of said basic cell trains and outputs a first data voltage;
   a second source wiring layer for supplying a second source voltage different in voltage level from said first source voltage to a second basic cell train which includes at least one of said basic cell trains and outputs a second data voltage;
   a voltage level shifter having a third basic cell train which includes at least one of said basic cell trains for shifting the first and the second data voltages outputted from each respective one of said first and second basic cell trains to a level adapted to an operation of the other of said first and second basic cell trains; and
   a wiring layer for connecting said first basic cell train with said second basic cell train through said voltage level shifter.

2. The gate array driven by a plurality of source voltages as defined in claim 1 wherein said first basic cell train, said voltage level shifter and said second basic cell train are arranged in said second direction in the described order.

3. The gate array driven by a plurality of source voltages as defined in claim 1 wherein said first basic cell train and said second basic cell train are arranged at positions adjacent to each other in said second direction.

4. A gate array driven by a plurality of source voltages comprising:
   a plurality of P-well regions and a plurality of N-well regions, each of which is formed on a semiconductor substrate in a first direction, said P-well and N-well regions being alternately arranged in a second direction perpendicular to said first direction;
   a first basic cell train outputting a first data voltage and a second basic cell train outputting a second data voltage each of which includes at least one pair of said P-well and N-well regions adjacent to each other in said second direction;
   a first source wiring layer for supplying a first source voltage to said first basic cell train;
   a second source wiring layer for supplying a second source voltage different in voltage level from said first source voltage to said second basic cell train; a voltage level shifter formed in an area containing at least three of said P-well and N-well regions adjacent to each other for shifting the first and the second data voltages outputted from each respective one of said first and second basic cell trains to a level adapted to an operation of the other of said first and second basic cell trains; and a wiring layer for connecting said first basic cell train with said second basic cell train through said voltage level shifter.

5. The gate array driven by a plurality of source voltages as defined in claim 4 wherein said first basic cell train, said voltage level shifter and said second basic cell train are arranged in said second direction in the described order.

6. The gate array driven by a plurality of source voltages as defined in claim 4 wherein said first basic cell train and said second basic cell train are arranged at positions adjacent to each other in said second direction.

7. A gate array driven by a plurality of source voltages comprising:
   a plurality of P-well regions and a plurality of N-well regions, each of which is formed on a semiconductor substrate in a first direction, said P-well and N-well regions being alternately arranged in a second direction perpendicular to said first direction;
   a first well region and a second well region formed by dividing at least one pair of said P-well and N-well regions adjacent to each other in said second direction into at least two regions in said first direction;
   a first basic cell train formed in said first well region and outputting a first data voltage;
   a second basic cell train formed in said second well region and outputting a second data voltage;
   a first source wiring layer for supplying a first source voltage to said first basic cell train;
   a second source wiring layer for supplying a second source voltage different in voltage level from said first source voltage to said second basic cell train;
   a voltage level shifter formed in a third well region containing at least three of said P-well and N-well regions adjacent to each other for shifting the first and the second data voltages outputted from each respective one of said first and second basic cell trains to a level adapted to an operation of the other of said first and second basic cell trains; and
   a wiring layer for connecting said first basic cell train with said second basic cell train through said voltage level shifter.

8. The gate array driven by a plurality of source voltages as defined in claim 7 wherein said third well region is divided into at least two regions in said first direction, said voltage level shifter being formed in one of said divided regions.

9. The gate array driven by a plurality of source voltages as defined in claim 7 wherein said first and second source wiring layers have parts extending in said second direction.

10. A gate array driven by a plurality of source voltages comprising:
    a basic cell region including a plurality of basic cells which are arranged in a matrix in a first direction and a second direction perpendicular to said first direction;
    an input/output cell region including a plurality of input cells and a plurality of output cells disposed therein;
    a first functional cell portion having a plurality of said basic cells and outputting a first data voltage disposed in a first region within said basic cell region;
    a second functional cell portion having a plurality of said basic cells and outputting a second data voltage disposed in a second region within said basic cell region;
    a first input cell portion provided within said input/output cell region and having at least one of said input cells for receiving a first source voltage;

a second input cell portion provided within said input/ output cell region and having at least one of said input cells for receiving a second source voltage different in voltage level from said first source voltage;

a first source wiring layer for connecting said first functional cell portion with said first input cell portion;

a second source wiring layer for connecting said second functional cell portion with said second input cell portion;

a voltage level shifter having a plurality of said basic cells disposed in a third region within said basic cell region for shifting the first and the second data voltages outputted from each respective one of said first and second basic cell trains to a level adapted to an operation of the other of said first and second basic cell trains; and a wiring layer for connecting said first functional cell portion with said second functional cell portion through said voltage level shifter.

11. The gate array driven by a plurality of source voltages as defined in claim 10 wherein said first and second regions are arranged in said first direction and located at positions different from each other in the second direction.

12. The gate array driven by a plurality of source voltages as defined in claim 10 wherein said basic cell region is divided into at least two regions in said first direction, said first region being positioned in one of said divided regions, and said second region being positioned in another one of said divided regions.

13. The gate array driven by a plurality of source voltages as defined in claim 12 wherein said first and second source wiring layers have parts extending in said second direction.

14. An electronic equipment comprising:

a gate array;

a first power source for outputting a first source voltage toward said gate array;

a second power source for outputting a second source voltage different in voltage level from said first source voltage toward said gate array;

a first circuit connected to said gate array and driven by said first source voltage from said first power source; and a second circuit connected to said gate array and driven by said second source voltage from said second power source;

wherein said gate array comprises:

a plurality of basic cell trains, each of which includes a plurality of basic cells arranged in a first direction, said plurality of basic cell trains being arranged in a second direction perpendicular to said first direction;

a first source wiring layer for supplying said first source voltage to a first basic cell train which includes at least one of said basic cell trains and outputs a first data voltage;

a second source wiring layer for supplying said second source voltage to a second basic cell train which includes at least one of said basic cell trains and outputs a second data voltage;

a voltage level shifter having a third basic cell train which includes at least one of said basic cell trains for shifting the first and the second data voltages outputted from each respective one of said first and second basic cell trains to a level adapted to an operation of the other of said first and second basic cell trains; and a wiring layer for connecting said first basic cell train with said second basic cell train through said voltage level shifter.

15. An electronic equipment comprising:

a gate array;

a first power source for outputting a first source voltage toward said gate array;

a second power source for outputting a second source voltage different in voltage level from said first source voltage toward said gate array;

a first circuit connected to said gate array and driven by said first source voltage from said first power source; and a second circuit connected to said gate array and driven by said second source voltage from said second power source;

wherein said gate array comprises:

a plurality of P-well regions and a plurality of N-well regions, each of which is formed on a semiconductor substrate in a first direction, said P-well and N-well regions being alternately arranged in a second direction perpendicular to said first direction;

a first basic cell train outputting a first data voltage and a second basic cell train outputting a second data voltage each of which includes at least one pair of said P-well and N-well regions adjacent to each other in said second direction;

a first source wiring layer for supplying said first source voltage to said first basic cell train;

a second source wiring layer for supplying said second source voltage to said second basic cell train;

a voltage level shifter formed in an area containing at least three of said P-well and N-well regions adjacent to each other for shifting the first and the second data voltages outputted from each respective one of said first and second basic cell trains to a level adapted to an operation of the other of said first and second basic cell trains; and a wiring layer for connecting said first basic cell train with said second basic cell train through said voltage level shifter.

16. An electronic equipment comprising:

a gate array;

a first power source for outputting a first source voltage toward said gate array;

a second power source for outputting a second source voltage different in voltage level from said first source voltage toward said gate array;

a first circuit connected to said gate array and driven by said first source voltage from said first power source; and a second circuit connected to said gate array and driven by said second source voltage from said second power source;

wherein said gate array comprises:

a plurality of P-well regions and a plurality of N-well regions, each of which is formed on a semiconductor substrate in a first direction, said P-well and N-well regions being alternately arranged in a second direction perpendicular to said first direction;

a first well region and a second well region formed by dividing at least one pair of said P-well and N-well regions adjacent to each other in said second direction into at least two regions in said first direction;

a first basic cell train formed in said first well region and outputting a first data voltage;

a second basic cell train formed in said second well region and outputting a second data voltage;

a first source wiring layer for supplying said first source voltage to said first basic cell train;

a second source wiring layer for supplying said second source voltage to said second basic cell train;

a voltage level shifter formed in a third well region containing at least three of said P-well and N-well regions adjacent to each other for shifting the first and the second data voltages outputted from each respective one of said first and second basic cell trains to a level adapted to an operation of the other of said first and second basic cell trains; and a wiring layer for connecting said first basic cell train with said second basic cell train through said voltage level shifter.

17. An electronic equipment comprising:

a gate array;

a first power source for outputting a first source voltage toward said gate array;

a second power source for outputting a second source voltage different in voltage level from said first source voltage toward said gate array;

a first circuit connected to said gate array and driven by said first source voltage from said first power source; and a second circuit connected to said gate array and driven by said second source voltage from said second power source;

wherein said gate array comprises:

a basic cell region including a plurality of basic cells which are arranged in a matrix in a first direction and a second direction perpendicular to said first direction;

an input/output cell region including a plurality of input cells and a plurality of output cells disposed therein;

a first functional cell portion having a plurality of basic cells and outputting a first data voltage disposed in a first region within said basic cell region;

a second functional cell portion having a plurality of basic cells and outputting a second data voltage disposed in a second region within said basic cell region;

a first input cell portion provided within said input/output cell region and having at least one of said input cells for receiving said first source voltage;

a second input cell portion provided within said input/output cell region and having at least one of said input cells for receiving said second source voltage;

a first source wiring layer for connecting said first functional cell portion with said first input cell portion;

a second source wiring layer for connecting said second functional cell portion with said second input cell portion;

a voltage level shifter having a plurality of said basic cells disposed in a third region within said basic cell region for shifting the first and the second data voltages outputted from each respective one of said first and second basic cell trains to a level adapted to an operation of the other of said first and second basic cell trains; and a wiring layer for connecting said first functional cell portion with said second functional cell portion through said voltage level shifter.

18. The electronic equipment as defined in claim 17 wherein said first and second regions are arranged in said first direction and located at positions different from each other in the second direction.

19. The electronic equipment as defined in claim 17 wherein said basic cell region is divided into at least two regions in said first direction, said first region being positioned in one of said divided regions, and said second region being positioned in another one of said divided regions.

20. The electronic equipment as defined in claim 19 wherein said first and second source wiring layers have parts extending in said second direction.

* * * * *